United States Patent
Thakur et al.

(10) Patent No.: US 6,174,806 B1
(45) Date of Patent: *Jan. 16, 2001

(54) HIGH PRESSURE ANNEALS OF INTEGRATED CIRCUIT STRUCTURES

(75) Inventors: Randhir P. S. Thakur; John K. Zahurak, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/790,279

(22) Filed: Jan. 28, 1997

(51) Int. Cl.$^7$ .................................................. H01L 21/44
(52) U.S. Cl. ........................... 438/653; 438/683; 438/909
(58) Field of Search ........................... 438/592, 652–655, 438/682, 685, 909, 683

(56) References Cited

U.S. PATENT DOCUMENTS

| | | | |
|---|---|---|---|
| 4,420,503 | * 12/1983 | Leung et al. | 427/85 |
| 4,845,055 | * 7/1989 | Ogata . | |
| 5,043,300 | 8/1991 | Nulman | 437/200 |
| 5,135,608 | 8/1992 | Okutani | 156/643 |
| 5,250,467 | 10/1993 | Somekh et al. | 437/192 |
| 5,356,835 | 10/1994 | Somekh | 437/192 |
| 5,434,044 | 7/1995 | Nulman et al. | 437/192 |
| 5,502,334 | 3/1996 | Shinohara | 257/751 |
| 5,527,561 | 6/1996 | Dobson | 427/383.3 |
| 5,534,461 | 7/1996 | Kawajima | 437/189 |
| 5,679,585 | * 10/1997 | Gardner et al. . | |
| 5,851,581 | * 12/1998 | Zenke | 427/97 |

OTHER PUBLICATIONS

Mizobuchi et al., "Application of Force fill Al–plug technology to 64 MB DRAM and 0.35 micron logic", 1995 Symposium on VLSI Technology, Digest of Technical Papers, (abstract only).*

* cited by examiner

Primary Examiner—Richard Booth
(74) Attorney, Agent, or Firm—Schwegman, Lundberg, Woessner & Kluth, P.A.

(57) ABSTRACT

According to one embodiment of the invention, a high pressure anneal is utilized to form titanium silicide at the bottom of a contact hole, at a pressure of at least approximately 1.1 atmospheres, from a reaction between deposited titanium and underlying silicon. When such high pressures are used, temperatures of less than approximately 700 degrees Celsius are utilized. According to another embodiment of the invention, a conductive plug fill material is deposited within a contact hole such that the plug structure is relatively free of voids. Either during deposition of the conductive plug fill material or after such deposition, the conductive plug fill material is subjected to a high pressure force-fill, at a pressure of at least approximately 1.1 atmospheres. When such high pressures are used, temperatures of less than approximately 700 degrees Celsius are utilized for the force-fill. Aluminum can be used for the conductive plug fill material when using this embodiment of the invention. In further embodiments, dielectrics deposited between conductive layers are reflowed at high pressure and low temperature. Still further, multiple metalized layers are connected by vias filled with conductive material using high pressure and low temperature.

9 Claims, 11 Drawing Sheets

HIGH PRESSURE ANNEALS OF INTEGRATED CIRCUIT STRUCTURES

FIELD OF THE INVENTION

The present invention relates to methods for fabricating semiconductor integrated circuits, and in particular, to forming contacts to various areas of such integrated circuits using high pressure annealing methods.

BACKGROUND OF THE INVENTION

Semiconductor integrated circuits (ICs) contain individual devices, which are typically operatively coupled together using metal line interconnects and various contacts. In most applications, the metal lines are formed on a different level than the devices, separated by an intermetal dielectric, such as silicon oxide or borophosphosilicate glass (BPSG). The most commonly used metal lines are aluminum, tungsten, copper, and combinations of the materials with refractory metals and silicon. Interconnects used to electrically couple devices and metal lines are formed between the individual devices and the metal lines. A typical interconnect is composed of a contact hole (i.e. opening) formed in an intermetal dielectric layer over an active device region. The contact hole is filled with a metal, such as aluminum or tungsten. Aluminum is preferred as an interconnect metal due to its high conductivity. Aluminum exhibits relatively low resistivity as compared to tungsten and, furthermore, is highly compatible with silicon oxide and other low temperature oxides, which are often used as the insulative material surrounding a contact hole. Furthermore, when metal lines are used, which are composed of aluminum, compatibility between the metal lines and the aluminum interconnect materials is optimized.

Interconnects often further contain a diffusion barrier layer sandwiched between the interconnect metal and the active device region at the bottom of the contact hole. Such layers prevent intermixing of the metal and material from the active device region, such as silicon, extending the life of the device. Passive titanium nitride diffusion barrier layers are the most common diffusion barrier layers.

Diffusion barrier layers are typically formed over a refractory metal silicide layer. Titanium silicide is the most commonly used refractory metal silicide due to its relatively low resistivity. The use of titanium silicide between titanium nitride and the active device region is preferred due to its intermediate crystallographic characteristics between those of silicon and titanium nitride, preventing increased resistivity resulting from a contact solely between silicon and titanium nitride. Silicon and titanium nitride have very different crystallographic characteristics. However, as aspect ratios (i.e. ratio of height to width of the contact hole) of typical contact holes increase to meet demands for high density ICs, uniform formation of titanium silicide at bottoms of contact holes is becoming more important, yet more difficult to obtain. Ideally, interconnects will exhibit zero impedance to current flow. However, interconnects typically exhibit near linear characteristics at best. An ohmic interconnect (i.e. one which exhibits linear current v. voltage characteristics and low resistance to current flow), provides optimum electrical performance. One way in which an interconnect is made more ohmic is by maintaining layers of uniform thickness and grain structure within a contact, such that there are not variations across the interconnect.

Furthermore, as ICs are scaled down in size, maintaining a minimal thermal budget during IC fabrication is also becoming more important. A thermal budget for fabricating an IC is the maximum combination of thermal steps and length of time during such thermal steps that an IC can withstand before its electrical characteristics are potentially degraded. For example, as ICs are scaled down in size, junction depths are becoming shallower. One of the problems associated with long thermal steps is dopant migration into undesired regions. Such shallow junctions are more easily degraded by long thermal steps due to dopant migration.

Of primary concern in depositing metal into a contact hole is obtaining adequate step coverage of the contact hole. This is particularly a problem when the contact holes have high aspect ratios, as seen more often as IC densities increase. To mitigate this problem, chemical vapor deposition (CVD) is used to deposit the metal instead of physical vapor deposition (PVD). CVD is more apt to adequately fill high-aspect ratio contact holes than PVD. However, to date, CVD aluminum exhibits rough, nonconformal layers on complex topographies, such as high aspect ratio contact holes, prior to surface modification. This is undesirable because voids often develop within a contact, due to the roughness of the CVD aluminum. Such voids severely increase the resistivity of an interconnect and degrade device performance by not providing uniform electrical connection across an interconnect. While high temperature steps are able to reflow metal within a contact hole after its deposition, they are undesirable because they increase the thermal budget as previously mentioned.

There is a need for a method for filling contact holes with aluminum or other similar materials, where the resulting contact hole is relatively free of voids. There is a further need for a method for forming titanium silicide effectively and uniformly on the bottom of contact holes, such that a minimal amount of thermal budget is consumed. Still further needs exist for filling holes such as vias connecting multiple metallic layers and for forming dielectric layers between capacitors to ensure that they are relatively free of voids.

SUMMARY OF THE INVENTION

The present invention teaches a method for forming contacts and/or conditioning the contacts to various areas of integrated circuits. In particular, this invention is advantageously utilized in contact holes having an aspect ratio of at least 2. Problems in obtaining adequate step coverage and uniformity of electrical connection in such contacts are overcome by use of the present invention. The same problems are also overcome for forming contacts between multiple layers of metalization, and in forming dielectrics between rough capacitor plates. This is accomplished while maintaining a low thermal budget.

In one embodiment, a high pressure anneal is utilized to form titanium silicide at the bottom of a contact hole. Titanium is first deposited on the bottom of a contact hole, which comprises silicon. Then, a titanium nitride layer is deposited on the titanium layer for a diffusion barrier layer. A high pressure anneal, at a pressure of significantly greater than one atmosphere (i.e. at least approximately 1.1 atmospheres) forms titanium silicide on the bottom of the contact hole from a reaction between the deposited titanium and underlying silicon. When such high pressures are used, temperatures of less than approximately 700 degrees Celsius are utilized, advantageously conserving thermal budget of a fabrication process. Depending on the type of refractory metals used, a preferred temperature range of 500 to 750 degrees Celsius and a pressure of 1.1 to 700 atmospheres is used. Furthermore, titanium silicide layers formed according to this embodiment of the invention have a more uniform thickness and more homogenous crystallographic structure. Thus, titanium silicide formed according to this invention provides a lower resistivity and more uniform ohmic interconnect structure.

In a further embodiment of the invention, the titanium nitride layer is omitted from the fabrication sequence. Then, the high pressure anneal occurs in a nitrogen-containing ambient to form a titanium nitride layer on the underlying titanium simultaneously with forming titanium silicide.

According to another embodiment of the invention, a conductive plug fill material is deposited within a contact or via hole such that the plug structure is relatively free of voids. Either during deposition of the conductive plug fill material or after such deposition, the conductive plug fill material is subjected to a high pressure force-fill. A pressure of at least approximately 1.1 atmospheres is used to adequately force the conductive plug material into the contact hole, providing an interconnect structure that is relatively free of voids. When such high pressures are used, temperatures of less than approximately 700 degrees Celsius are utilized, advantageously conserving thermal budget of a fabrication process. By using this invention to force-fill conductive plug fill materials, aluminum can be used for the conductive plug fill material, as is preferable compared to typically used tungsten. Aluminum provides for lower resistivity, more ohmic interconnect structures. Void-free plugs within an interconnect alleviate the conventional problem with non-uniform electrical connections across contact holes previously filled with aluminum. The use of such interconnect structures is especially useful in the formation of multiple layers of metalized conductors.

In one embodiment of the invention, aluminum is used to form the plugs, and at the same time, a layer of metalization is formed over the surface of the integrated circuit. It is then patterned to form desired conductive paths. Dielectric material is then formed over the metal layer and annealed in a high pressure environment. Further contacts, additional metal layers and dielectric layers are then formed, resulting in multiple layers of connected conductors while conserving thermal budget.

In a further embodiment, high pressure and low temperature are used to anneal dielectric material between capacitor containers. The pressures used range from at least approximately 1.1 atmospheres and higher, while the temperature is held to less than approximately 600 degrees Celsius. In one embodiment, pressures between 10 to 50 atmospheres are used. The space between capacitor containers may have structures with high aspect ratios. A force fill at high pressure as described helps ensure a reduction in resulting from deposition of such dielectric layers.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

FIGS. 1A to 1D illustrate intermediate structures formed during fabrication of an interconnect according to one embodiment of the method of the invention. FIG. 1E illustrates a completed interconnect structure formed according to one embodiment of the method of the invention. FIGS. 1F and 1G illustrate completed interconnect structures formed according to further embodiments of the method of the invention. The Figures are representative Figures and do not represent exact scaling and dimensions of actual interconnect structures unless stated otherwise.

Figure 1A:
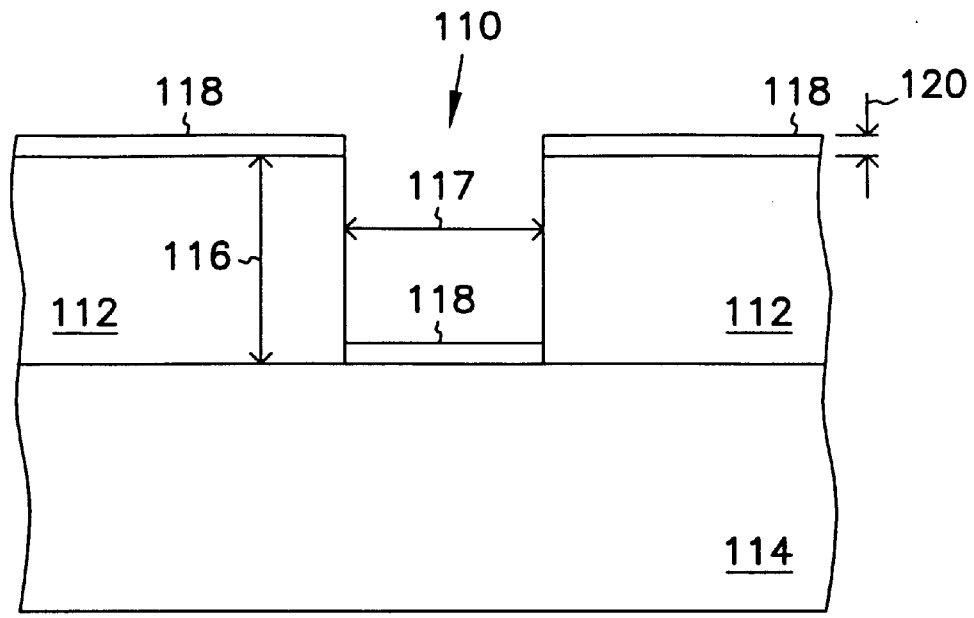
FIGS. 1A to 1D are cross-sectional representations of intermediate interconnect structures formed according to one embodiment of the method of the invention.

As illustrated in FIG. 1A, a contact hole 110 is defined in an insulating material 112 overlying a substrate 114 comprising silicon. The insulating material 112 used is typically borophosphosilicate glass (BPSG) due to its ability to reflow. However, any insulating material 112, such as silicon oxide or silicon nitride, can be used for the insulating material layer 112. Currently, the thickness 116 of the insulating material layer 112 is approximately 25,000 angstroms. Thus, the depth of the interconnect is also approximately 25,000 angstroms. The diameter 117 of the contact hole 110 is currently approximately 5,000 angstroms, resulting in an aspect ratio of approximately 5:1. Thus, the following examples are described with reference to these dimensions. However, the dimensions of the interconnect are adjusted according to the dimensions of the contact hole at the time of fabricating the interconnect structure. Aspect ratios of as low as 2:1 and higher than 5:1 are also common and within the range where the current invention is useful.

As further illustrated in FIG. 1A, a relatively thin layer of titanium 118 is deposited on the top surfaces and bottom surface of the contact hole 110. Typically, the titanium layer 118 is deposited using physical vapor deposition (PVD), as well known to one skilled in the art. The thickness 120 of the titanium layer 118 is approximately 500 to 2,000 angstroms and typically approximately 1,300 angstroms. This titanium layer 118 serves as a barrier layer between the underlying substrate 114 and subsequently-deposited materials.

Figure 1B:
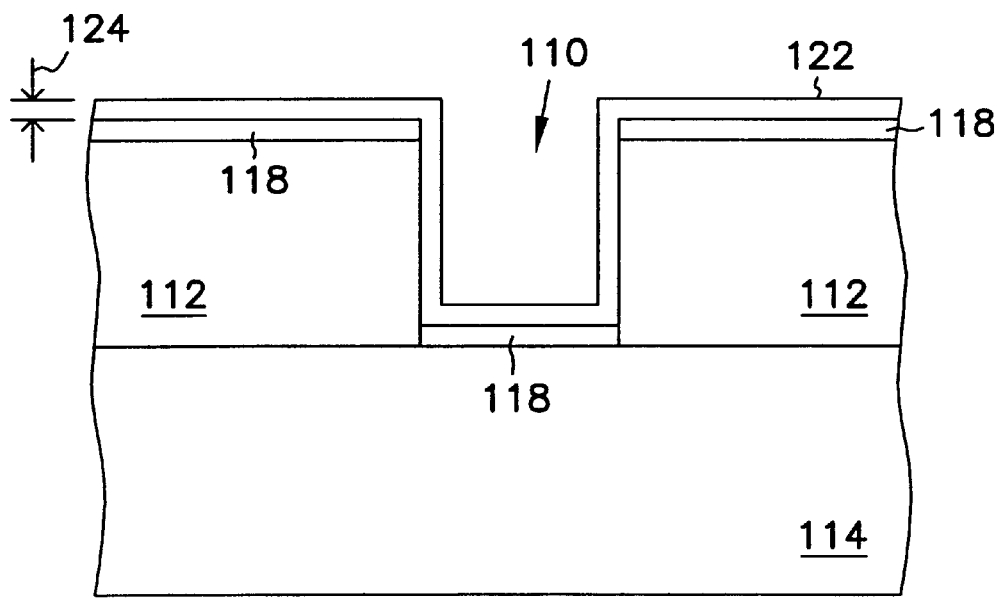

As illustrated in FIG. 1B, a relatively thin layer of titanium nitride (TiN) 122 is then deposited on the titanium layer 118. Typically, the TiN layer 122 is deposited using chemical vapor deposition (CVD), as well known to one skilled in the art, to deposit on sidewalls of the contact hole 110 as well as on the bottom and top surfaces of the contact hole 110. The thickness 124 of the TiN layer 122 is approximately 30 to 300 angstroms and typically approximately 150 angstroms. This TiN layer 122 promotes adhesion between the underlying surfaces and subsequently-deposited tungsten or aluminum.

Figure 1C:
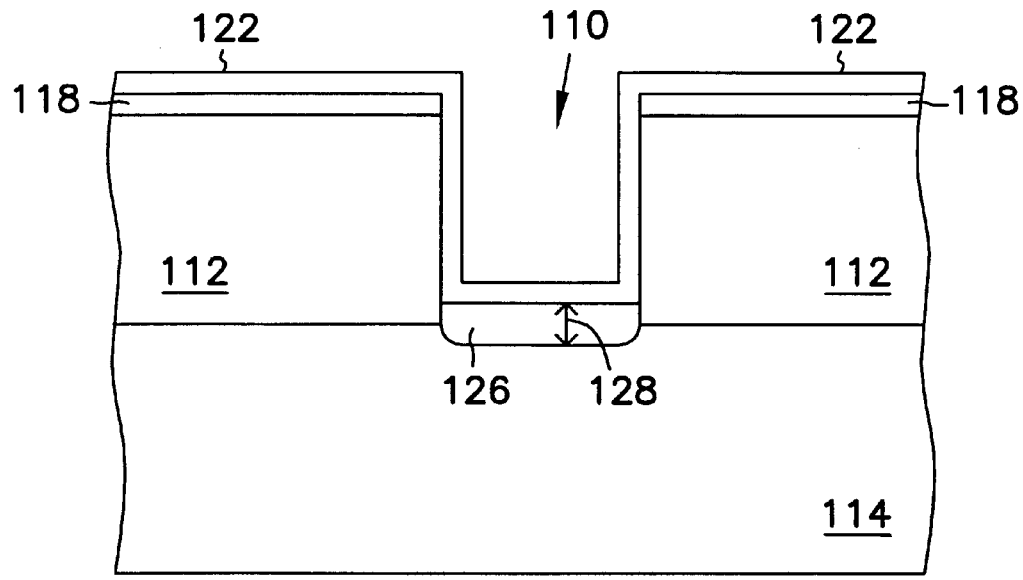

Next, titanium silicide ($TiSi_2$) 126 is formed at the bottom of the contact hole, consuming silicon from the substrate 114, as illustrated in FIG. 1C. To form the $TiSi_2$ 126, the structure illustrated in FIG. 1B is annealed using a high pressure processing chamber, such as a GaSonics, Inc. Vertical High Pressure (VHP) furnace. A chamber pressure of significantly greater than one atmosphere is used, such as approximately 1.1 to 700 atmospheres. In this example, a chamber pressure of approximately 25 atmospheres is used to produce the $TiSi_2$ layer 126 illustrated in FIG. 1C. By using such relatively high pressure for the anneal, the $TiSi_2$ 126 is formed having a more uniform thickness 128 and more homogenous crystallographic structure. A more uniform thickness 128 provides a more reliable interconnect. Furthermore, a homogenous crystallographic structure provides a lower resistivity, more ohmic interconnect.

An inert gas, such as argon, is typically used for the processing chamber ambient when forming $TiSi_2$ 126 in accordance with the method of the invention. However, in a further embodiment of the invention, the TiN layer 122 is not deposited on the underlying titanium layer 118. Instead, the titanium layer 118 is annealed in a high pressure processing chamber of the present invention, using a nitrogen-containing ambient. Annealing titanium using a nitrogen-containing ambient is well known to one skilled in the art. Thus, TiN 118 and $TiSi_2$ 126 are formed simultaneously during the high pressure anneal. The resulting structure is illustrated in FIG. 1F.

Another advantage of using a high pressure anneal to form the $TiSi_2$ 126 is that it conserves valuable thermal budget. In conventional systems, the thermal budget is conserved by lowering processing temperatures, deteriorating thermal performance of active kinetics. Namely, active kinetics in this invention are those associated with the diffusion of both titanium 118 and silicon from the underlying substrate 114. By increasing the pressure of the annealing chamber, annealing temperatures are reduced by approximately more than 200 degrees Celsius to temperatures of approximately 700 degrees Celsius or less, without deteriorating thermal performance of active kinetics. Thus, the peak anneal temperature is reduced, while maintaining good silicidation at the bottom of a contact hole 110. The time of anneal varies depending on dimensions of structures and materials, and is easily varied by one skilled in the art to obtain desired device characteristics.

Figure 1D:
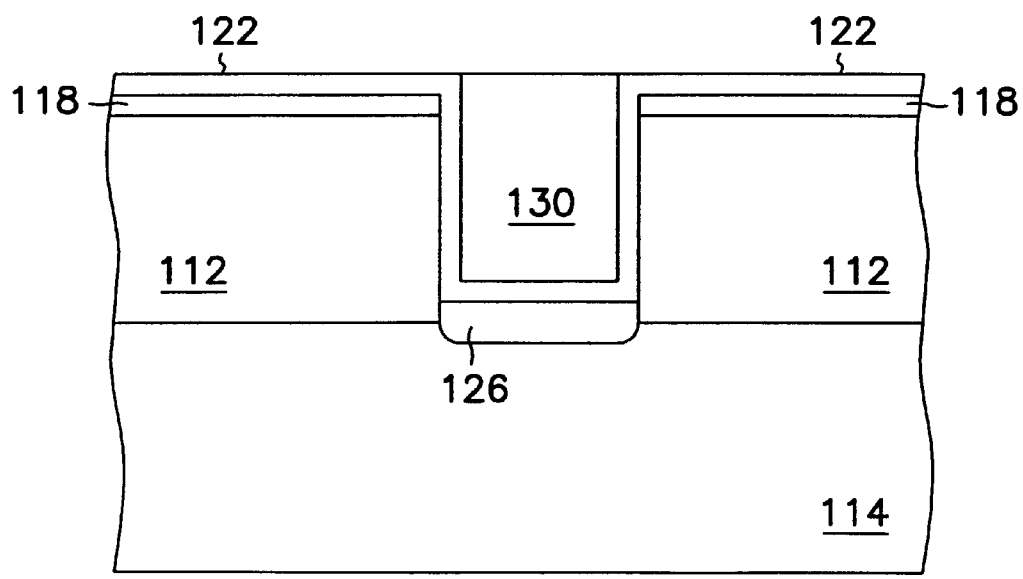
Figure 1E:
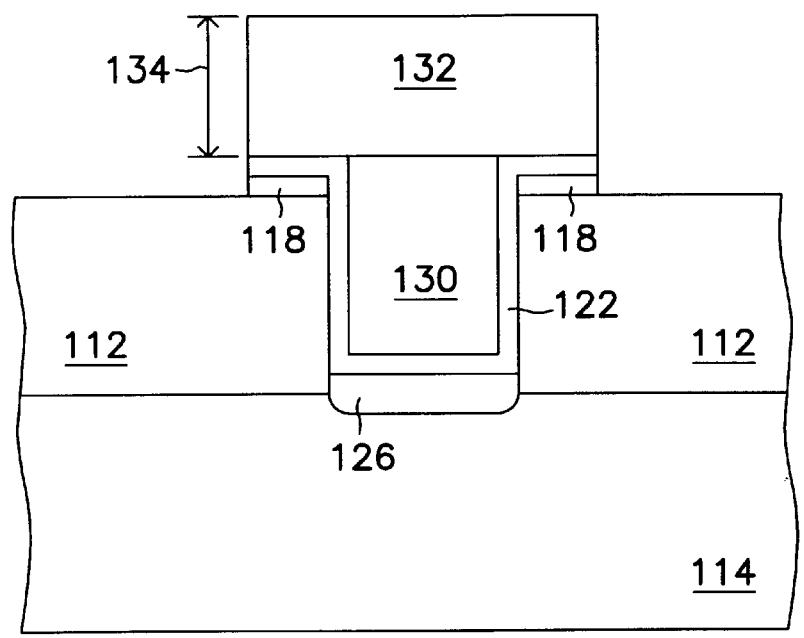
FIG. 1E is a cross-sectional representation of an interconnect structure formed according to one embodiment of the method of the invention, intermediate structures of which are illustrated in FIGS. 1A to 1D.
Figure 1F:
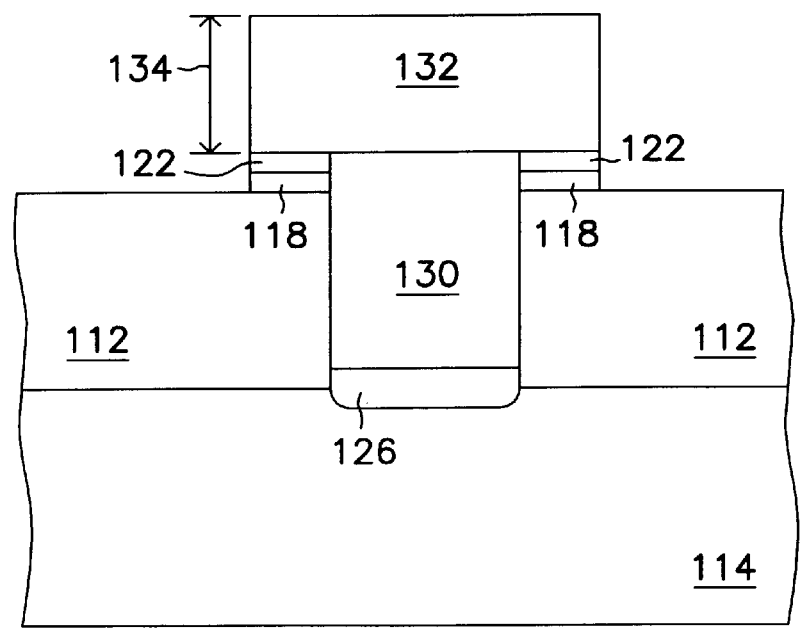
FIGS. 1F and 1G are cross-sectional representations of interconnect structures formed according to further embodiments of the method of the invention.
Figure 1G:
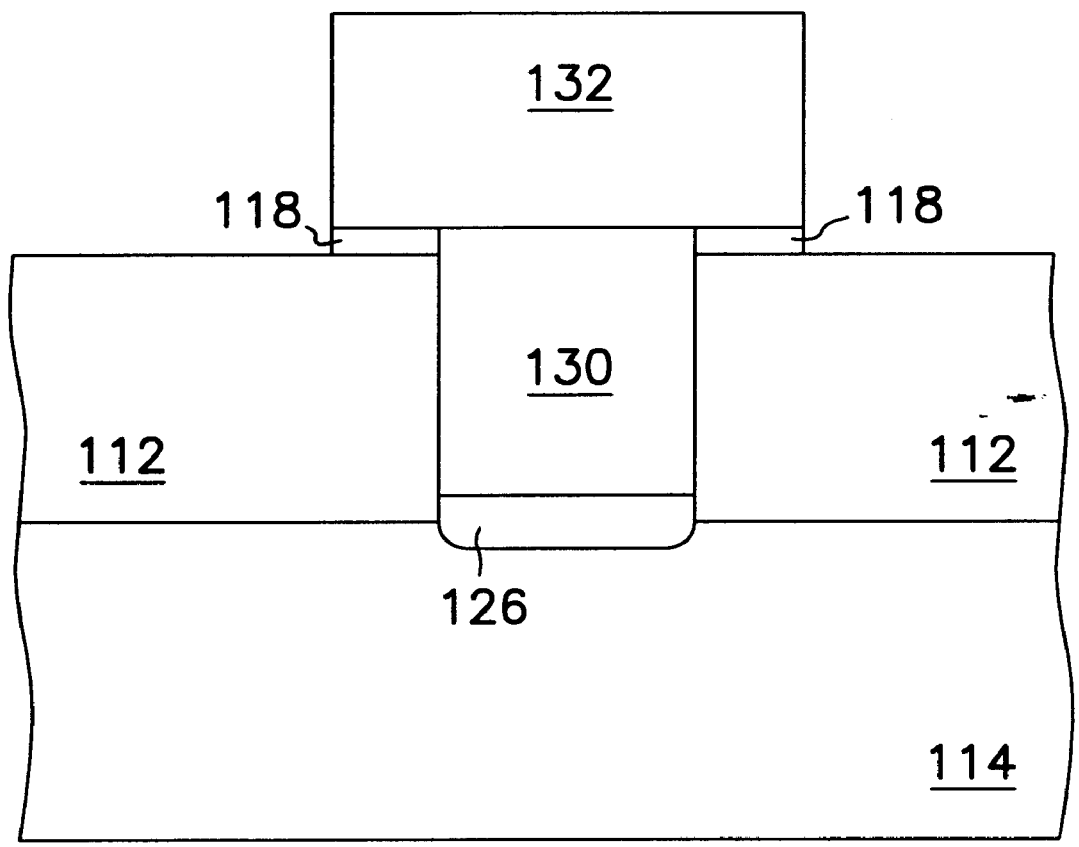

The next step in the interconnect fabrication process comprises forming a tungsten (W) plug 130 in the contact hole 110, as illustrated in FIG. 1D. Typically, when the aspect ratio of the contact hole 110 is 5 or greater, as in the present example, CVD-W 130 is used to provide adequate step coverage. CVD-W 130 is deposited to a depth sufficient to fill the contact hole 110, as well known to one skilled in the art. Typically, CVD-W 130 is deposited as a blanket layer over the structure shown in FIG. 1C and etched or processed using a planarization method, such as chemical mechanical polishing (CMP), to form the plug. A dry etchant, such as a $CF_4$:$CHF_3$:Ar:$N_2$ etch in a ratio of approximately 1:2:4:1, typically completes the plug 130 formation. While the present invention is described by way of utilizing a CVD-W plug 130, other metal plug materials can be used, so long as they adequately fill the contact hole 110 without forming considerable voids therein. Aspect ratios of as low as 2:1 and higher than 5:1 are also common and within the range where the current invention is useful.

Finally, as illustrated in FIG. 1E, aluminum 132 is deposited over the structure shown in FIG. 1D. The thickness 134 of the deposited aluminum 132 is approximately 2,000 to 5,000 angstroms. After patterning, the aluminum layer 132 and underlying titanium and TiN layers 118 and 122, respectively, are etched to form aluminum metal lines 132 in an integrated circuit, completing contact formation. A dry etchant, such as a $Cl_2$:$BCl_3$ etch in a ratio of approximately 2:1 is typically used to form the metal lines 132. While the present invention is described by way of utilizing aluminum for the metal lines 132, other metallization materials can be substituted for aluminum, without departing from the scope of the invention. Also, the technique used to define the metal lines 132 and underlying metal plug 130 can be done using a damascene process as well known to one skilled in the art.

According to a further embodiment of the method of the invention, as illustrated in FIG. 1G, the TiN layer 122, as illustrated in FIG. 1E, is omitted from the fabrication process and the anneal to form $TiSi_2$ 126 is not performed in a nitrogen-containing ambient. The TiN layer 122 is conventionally needed to promote adhesion between the silicided bottom 126 of the contact hole and subsequently-deposited metal 130. By using the relatively high pressure anneal of the present invention, a TiN layer 122 can be omitted. The homogenous crystallographic structure of $TiSi_2$ 126 layers formed according to the method of the invention provides for better adhesion to adjacent layers 130.

Figure 2A:
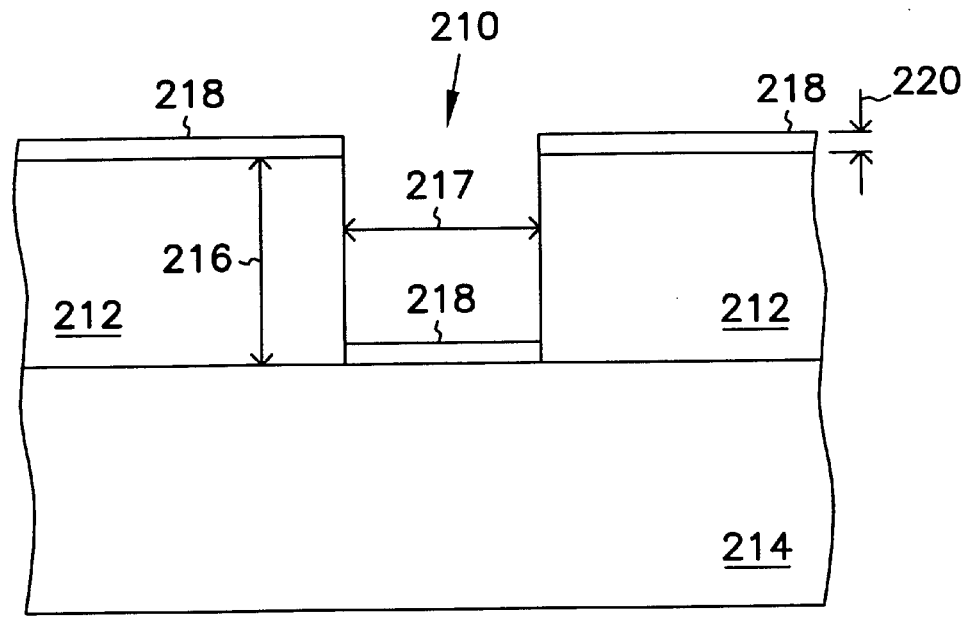
FIGS. 2A to 2C are cross-sectional representations of intermediate interconnect structures formed according to another embodiment of the method of the invention, where a contact hole is force-filled with a metal.
Figure 2B:
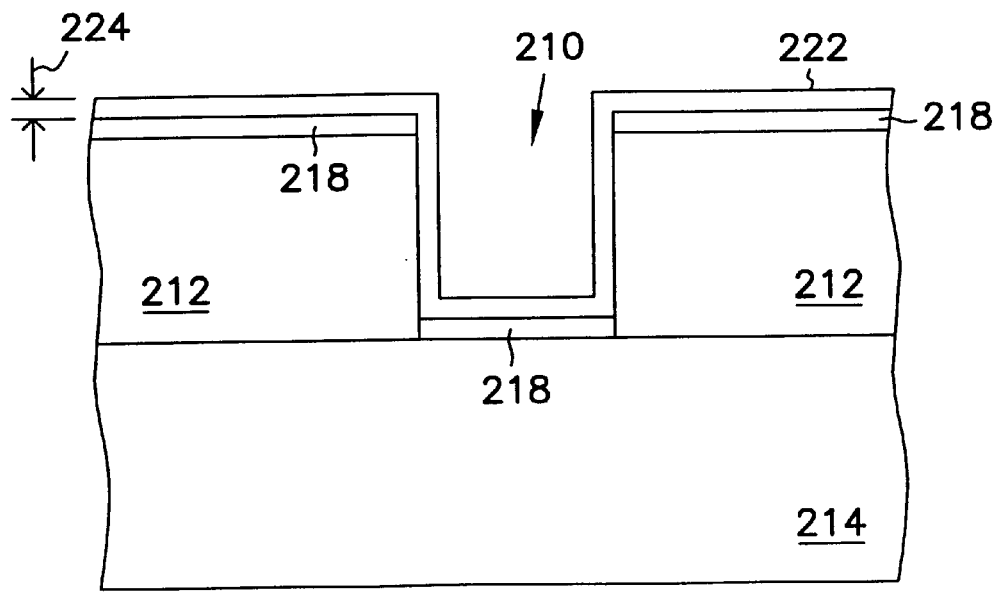
Figure 2C:
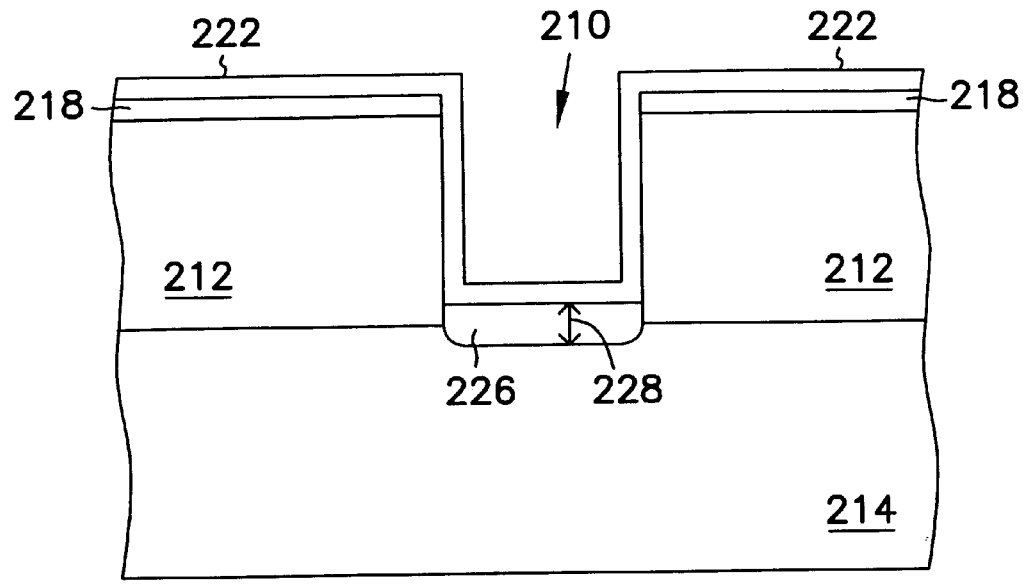
Figure 2D:
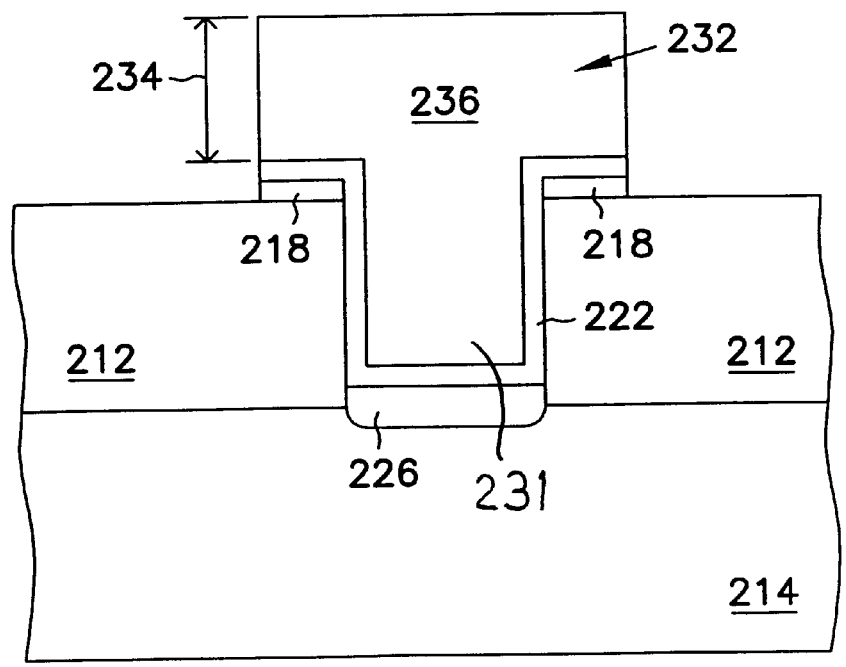
FIG. 2D is a cross-sectional representation of an interconnect structure formed according to one embodiment of the method of the invention, where the contact hole is force-filled with a metal, intermediate structures of which are illustrated in FIGS. 2A to 2C.

According to another aspect of the present invention, a force-fill is used to adequately fill a contact hole 210 with a metal, as illustrated by intermediate structures in FIGS. 2A to 2C, and a completed interconnect structure illustrated in FIG. 2D. FIGS. 2E to 2I illustrate further embodiments of completed interconnect structures formed according to this aspect of the method of the invention. FIGS. 2A to 2I are representative Figures and do not represent exact scaling and dimensions of actual interconnects.

As illustrated in FIG. 2A, a contact hole 210 is defined in an insulating material 212 overlying a substrate 214 comprising silicon. The insulating material 212 used is typically borophosphosilicate glass (BPSG) due to its ability to reflow. It is deposited in a conventional manner. However, any insulating material 212, such as silicon oxide or silicon nitride, can be formed for the insulating material layer 212. Currently, the thickness 216 of the insulating material layer 212 is approximately 25,000 angstroms. Thus, the depth of the interconnect is approximately 25,000 angstroms also. The diameter 217 of the contact hole 210 is currently approximately 5,000 angstroms, resulting in an aspect ratio of approximately 5:1. Thus, the following examples are described with reference to these dimensions. However, the dimensions of the interconnect are adjusted according to the dimensions at the time of fabricating the interconnect structure which may have aspect ratios of as low as 2:1 and higher than 5:1.

As further illustrated in FIG. 2A, a relatively thin layer of titanium 218 is deposited on the top surfaces and bottom surface of the contact hole 210. Typically, the titanium layer 218 is deposited using physical vapor deposition (PVD) as well known to one skilled in the art. The thickness 220 of the titanium layer 218 is approximately 500 to 2,000 angstroms and typically approximately 1,300 angstroms. This titanium layer 218 serves as a barrier layer between the underlying substrate 214 and subsequently-deposited materials.

As illustrated in FIG. 2B, a relatively thin layer of titanium nitride (TiN) 222 is then deposited on the titanium layer 218. Typically, the TiN layer 222 is deposited using chemical vapor deposition (CVD), as well known to one skilled in the art, to deposit on sidewalls of the contact hole 210 as well as on the bottom and top surfaces of the contact hole 210. The thickness 224 of the TiN layer 222 is approximately 30 to 300 angstroms and typically approximately 150 angstroms. This TiN layer 222 promotes adhesion between the underlying surfaces and subsequently-deposited metal.

Next, TiSi$_2$ 226 is formed at the bottom of the contact hole consuming silicon from the substrate 214, as illustrated in FIG. 2C. To form the TiSi$_2$ 226, the structure illustrated in FIG. 2B is annealed using a high pressure chamber, such as a GaSonics, Inc. VHP furnace. A chamber pressure of significantly greater than one atmosphere is used, such as approximately 1.1 to 700 atmospheres. An inert gas, such as argon, is typically used for the processing chamber ambient. In this example, a chamber pressure of approximately 25 atmospheres is used to produce the TiSi$_2$ layer 226 illustrated in FIG. 2C. By using such relatively high pressure for the anneal, the TiSi$_2$ 226 formed has a more uniform thickness 228 and more homogenous crystallographic structure. A more uniform thickness 228 provides a more reliable interconnect. Furthermore, a homogenous crystallographic structure provides a lower resistivity, more ohmic interconnect.

An inert gas, such as argon, is typically used for the processing chamber ambient when forming TiSi$_2$ 226 in accordance with the method of the invention. However, in a further embodiment of the invention, the TiN layer 222 is not deposited on the underlying titanium layer 218. Instead, the titanium layer 218 is annealed in a high pressure processing chamber of the present invention, using a nitrogen-containing ambient. Annealing using a nitrogen-containing ambient is well known to one skilled in the art. Thus, TiN 218 and TiSi$_2$ 226 are formed simultaneously during the high pressure anneal. The resulting structure is the same as that illustrated in FIG. 2D.

Another advantage of using a high pressure anneal to form the TiSi$_2$ 226 is that it conserves valuable thermal budget. In conventional systems, the thermal budget has been conserved by lowering processing temperatures, deteriorating thermal performance of active kinetics. Namely, active kinetics in this invention are those associated with the diffusion of both titanium 218 and silicon from the underlying substrate 214. By increasing the pressure of the annealing chamber, annealing temperatures are reduced by approximately more than 200 degrees Celsius to temperatures of approximately 700 degrees Celsius or less, without deteriorating thermal performance of active kinetics. Thus, the peak anneal temperature is reduced, while maintaining good silicidation at the bottom of a contact hole 210.

The next step in the interconnect fabrication process comprises filling the contact hole 210 with a metal 236, such as aluminum, and patterning metal lines 232 having a thickness 234 of approximately 2,000 to 5,000 angstroms, as illustrated in FIG. 2D.

Conventionally, when the aspect ratio of the contact hole 210 is 5 or greater, as in the present example, CVD-W has been used to provide adequate step coverage when filling the contact hole 210. However, aluminum is preferable for a plug 231 fill material due to its lower resistivity. Conventionally, aluminum does not adequately fill high aspect ratio contact holes 210 without forming voids therein. In the present invention, the metal plug 231 is deposited in a CVD reaction chamber having a chamber pressure of significantly greater than one atmosphere, such as approximately 1.1 to 700 atmospheres. An inert gas, such as argon, is typically used for the processing chamber ambient. Thus, in this example, CVD-Al 231 is able to be used for the contact hole 210 fill, rather than forming a separate tungsten plug, because the relatively high pressure during CVD-Al 231 deposition prevents voids from forming in the contact hole 210. In a further embodiment, a pressure between 10 and 50 atmospheres is used to fill contact holes having aspect ratios greater than approximately 2:1.

In yet a further embodiment of the invention, CVD-Al 231 is first deposited within the contact hole 210 and then force-filled by annealing at a pressure of approximately 1.1 to 700 atmospheres. By using such high pressures for the anneal, temperatures of approximately less than 700 degrees Celsius are utilized, advantageously conserving the thermal budget. Pressures between 10 and 50 atmospheres are used in a further embodiment.

It is further advantageous to use aluminum for the metal plug 231 because CVD-Al 231 is deposited to a depth sufficient enough to fill the contact hole 210 and allow for formation of metal lines 232 above the contact hole 210 by patterning a single blanket deposition aluminum layer (not shown), as well known to one skilled in the art. The use of aluminum for the metal plug 231 eliminates the necessity for a separate plug etch or planarization step, such as using CMP. The aluminum layer 232 and underlying titanium and TiN layers 218 and 222, respectively, are etched to form aluminum metal lines 232 in an integrated circuit, completing contact formation. A dry etchant, such as a Cl$_2$:BCl$_3$ etch in a ratio of approximately 2:1 is typically used to form the metal lines 232. However, the technique used to define the metal lines 232 and underlying metal plug 231 can be done using a damascene process as well known to one skilled in the art.

Figure 2E:
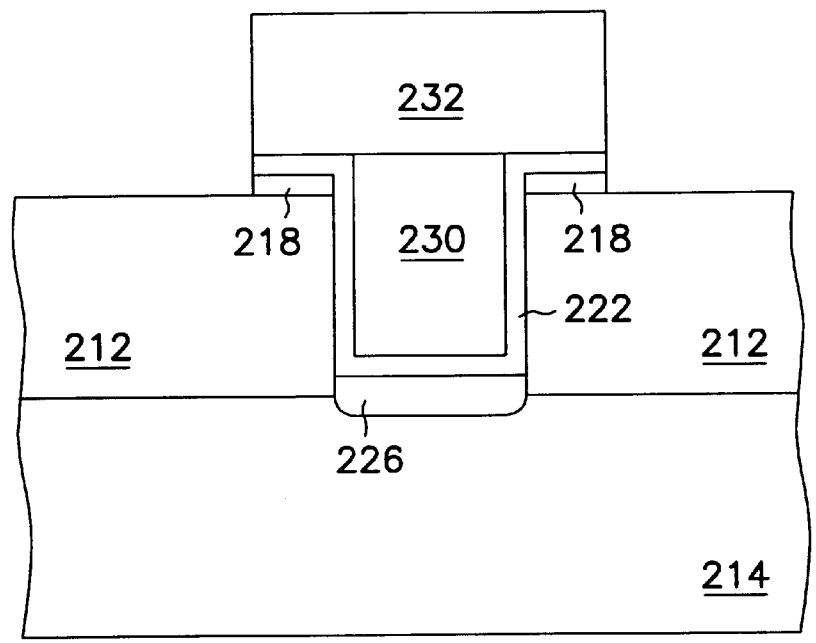
FIGS. 2E to 2I are cross-sectional representations of interconnect structures formed according to further embodiments of the method of the invention, where the contact hole is force-filled with a metal.

While the present invention is described by way of utilizing CVD-Al as a single material with which the contact hole 210 is filled and metal lines 232 are created, as illustrated in FIG. 2E, force-filled metal plugs, such as tungsten 230, can be used instead as in the first embodiment of the invention, with aluminum formed thereon for the metal lines 232. Furthermore, other metallization materials can be used for the metal lines 232. The scope of this inventive step covers any conductive material force-filled in a contact hole 210, so long as the material adequately fills the contact hole 210 using the relatively high deposition pressures of the invention, without forming considerable voids therein.

Figure 2F:
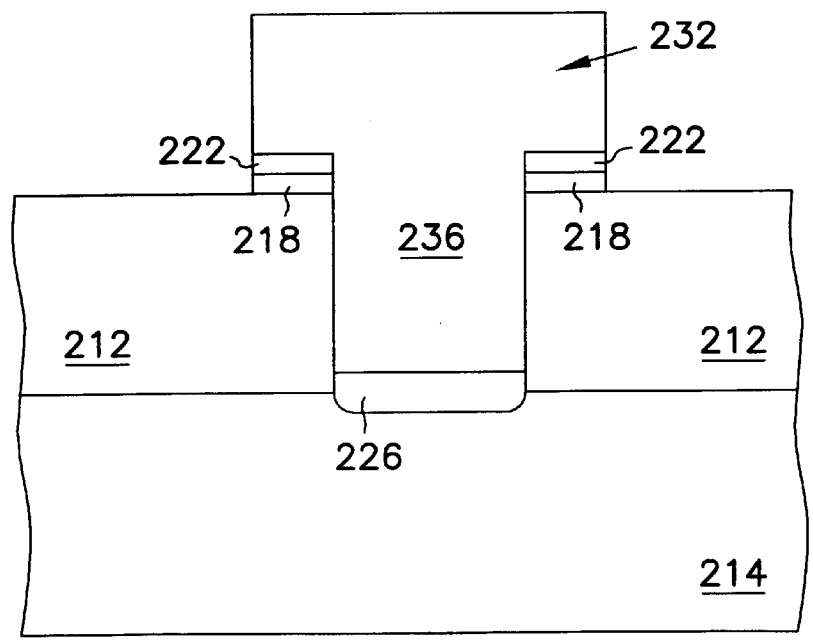
Figure 2G:
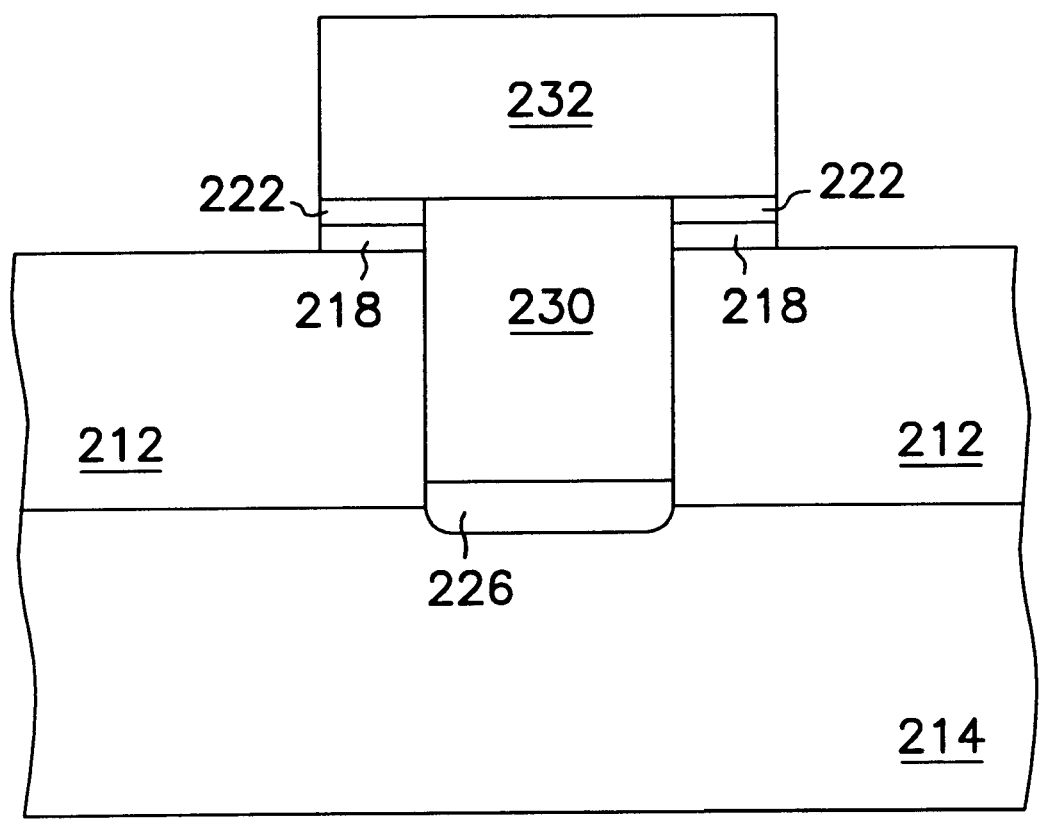
Figure 2H:
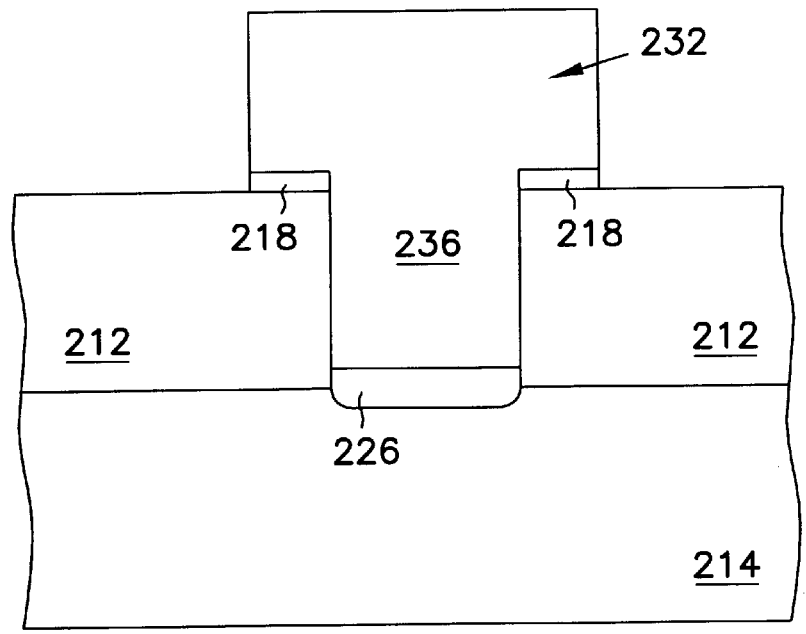
Figure 2I:
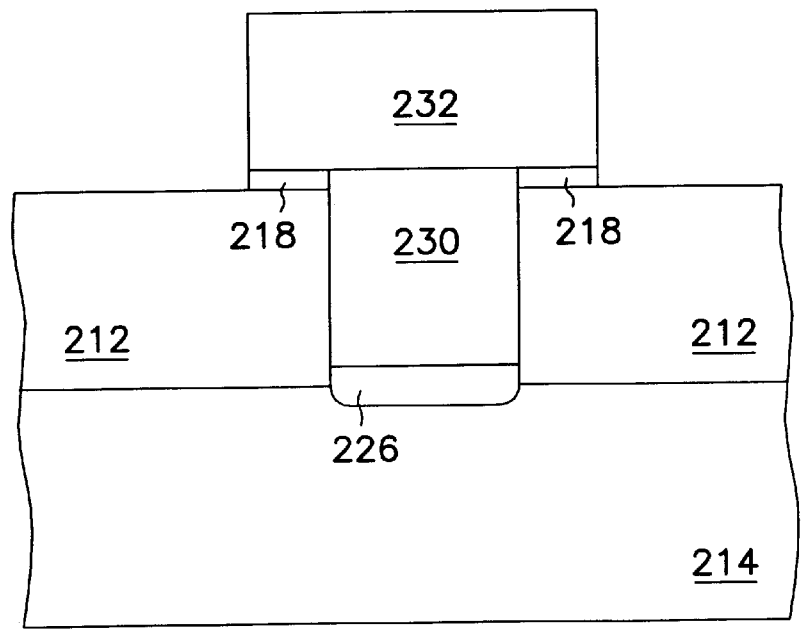

According to a further embodiment of the invention, as illustrated in FIGS. 2F and 2G, the TiN layer 222 on the side walls of the contact hole 210, as illustrated in FIGS. 2D and 2E, is formed only on the top and bottom surfaces, and not on the side walls by use of conventional techniques, and the anneal to form $TiSi_2$ 226 comprises annealing in a nitrogen-containing ambient. In yet a further embodiment of this aspect of the method of the invention, as illustrated in FIGS. 2H and 2I, the TiN layer 222 is entirely omitted from the fabrication process and the anneal to form $TiSi_2$ 226 comprises annealing in an ambient that does not contain nitrogen. The TiN layer 222 is conventionally needed to promote adhesion between the silicided bottom 226 of the contact hole and subsequently-deposited metals 230, 236 comprising aluminum or aluminum and tungsten or yet further combinations as previously described. By using the relatively high pressure anneals of the present invention, a TiN layer 222 can be omitted. The homogenous crystallographic structure of $TiSi_2$ layers 226 formed according to the method of the invention provides for better adhesion to adjacent layers 230, 236. Furthermore, by utilizing a relatively high pressure force fill of the contact hole 210, as in this aspect of the method of the invention, even better adhesion is provided.

Figure 3:
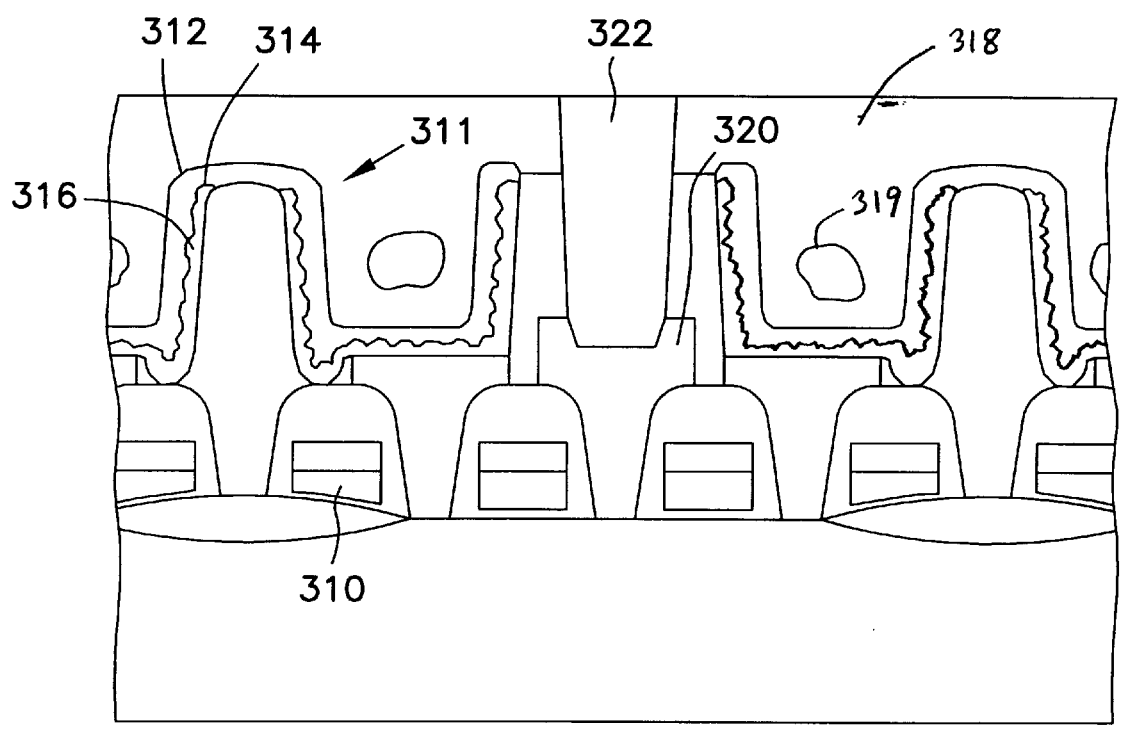
FIG. 3 is a cross-sectional representation of interconnect structures in a memory cell having access transistors and capacitive cells with dielectric between plates.

In FIG. 3, the plural embodiments of contacts and their formation are illustrated in the context of a dynamic random access memory device. A plurality of word lines 310 which also serve as gates for access transistors in a well known manner are shown in cross section. A plurality of plugs 320 have been formed between each of the word lines in order to make contact to drains and sources of the underlying access transistors. Such plugs 320 have been formed using the high pressure techniques described above, and using the same materials and combinations of materials as described. The word lines are suitably insulated from the plugs. Capacitor containers, such as that indicated generally at 311 comprise first plates 316 separated from second plates 312 by dielectric 314 and are formed over the word lines. Plate 316 is formed in a known manner such that its surface is rough, having structures with high aspect ratios. Such aspect ratios vary from 2:1 to higher than 5:1. This helps increase the capacitance by increasing the surface area of the capacitor plates. A bit contact 322 is then formed in electrical contact with plug 320. The contact may also be formed using the high pressure techniques and materials described above.

An insulative dielectric layer 318 is then formed, as by deposition, and then reflowed in a high pressure environment to force fill in high aspect ratio structures formed between capacitor containers 311. Such structures may initially be formed with voids 319 shown in exaggerated form. The dielectric layer 318 comprises plasma oxides and other depositive oxides which are deposited at low temperatures and then subjected to rapid thermal anneal or furnace reflow at high pressures of between greater than approximately 1.1 to 700 atmospheres in temperatures of less than approximately 600 to 500 degrees Celsius to greatly reduce voids. Further low dielectric materials may also be used for dielectric layer 318 such as boron nitride, boron silicon nitride and polymeric oxides such as Teflon and spun on glass. The reflow in a further embodiment is conducted at pressures between 10 and 50 atmospheres. As in all of the reflows described herein, the pressure is a function of the maximum aspect ratio to be filled. The higher the aspect ratio, the greater the pressure used to completely and uniformly fill the structure.

Figure 4:
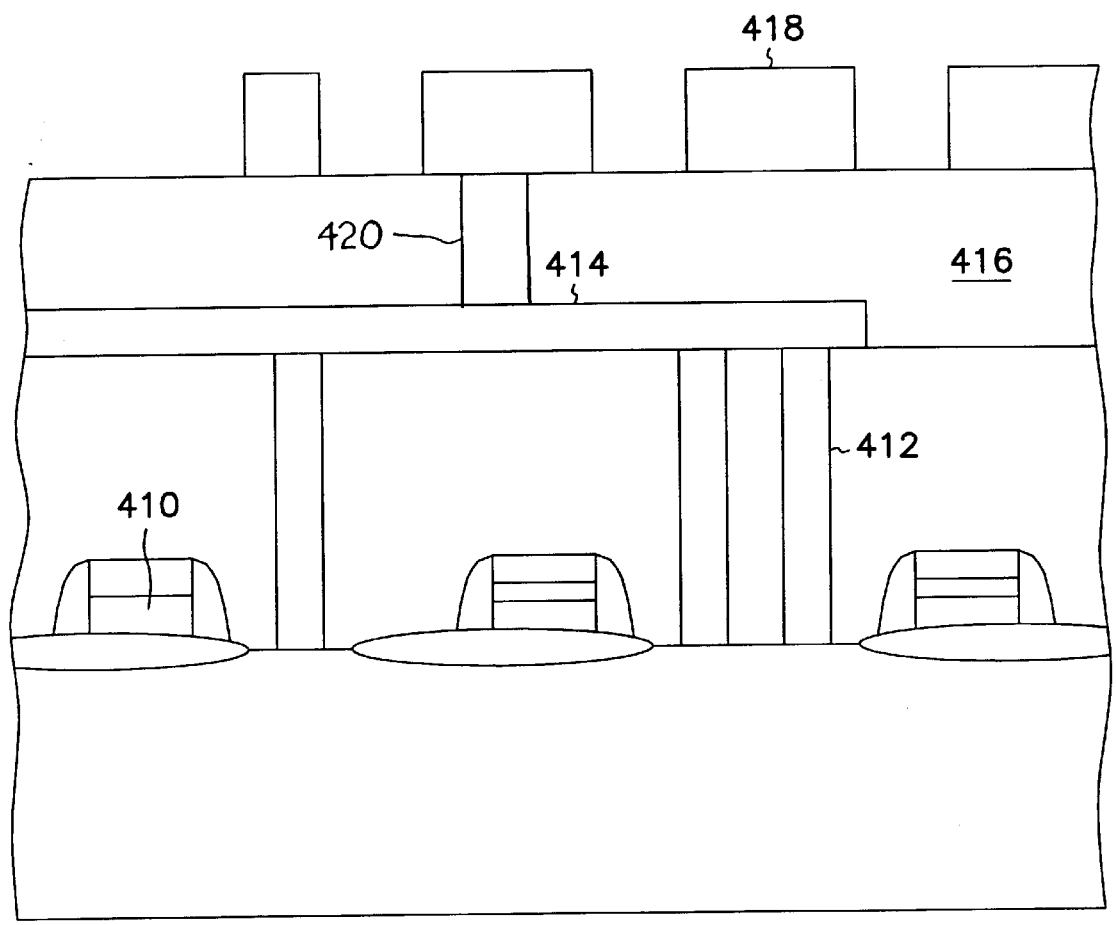
FIG. 4 is a back end cross-sectional representation of a memory device formed according to one embodiment of the invention showing word lines and a multilevel metalization.

The techniques of the present invention may also be used in other circuit structures. In FIG. 4, the above described high pressure techniques were used to form various contacts between multiple layers of metalization in circuitry peripheral to a memory array. A cross section of a word line 410 is shown, as are multiple bit contacts 412 and a first metalization layer 414. As described above, the bit contact and metal layer 414 may be both formed of aluminum using high pressure anneals to reduce voids and minimize the impact on the thermal budget. Also shown in FIG. 4, following formation and high pressure anneal as described above of an insulating interlayer material such as BPSG or undoped oxide layer 416, a second metalization layer 418 is formed, comprising multiple conductive lines of a second metal, such as aluminum. A via 420 between the first and second metalization layers is also formed of aluminum or tungsten and annealed in a high pressure processing chamber. A chamber pressure of significantly greater than one atmosphere is used, such as approximately 1.1 to 700 atmospheres. An inert gas such as argon, is typically used for the processing chamber ambient. An anneal at temperatures of less than approximately 600 or 500 degrees Celsius are then utilized, advantageously conserving thermal budget. Thus, CVD-Al is able to be used for both contact and intermetal layer vias using similar processing steps. As described above, pressures of between 10 and 50 atmospheres may also be used depending on the aspect ratios of the structures to be filled and the anneal temperature.

When aluminum is used to form the vias, it may also be used to form a blanket second level of metalization which can thereafter be patterned in the same manner as the first level of metalization was formed with the contacts and pattered as described with reference to FIGS. 2A–I. In this manner, many more layers of metal may be formed either forming vias and metalization layers at the same time, or forming the via and metalization layers separately. Note that with many layers, it is important to further conserve thermal budget by keeping the temperature below approximately 500 degrees Celsius to prevent undesired dopant migration. Each metalization layer is patterned and covered by an insulative material so that the next layer may be formed. The insulative material may also be annealed in high pressures as previously described.

In conclusion, interconnect structures comprising vias and contacts formed according to the methods of the invention, are more reliable and reproducible than conventional interconnect structures. Such interconnect structures are formed while conserving valuable thermal budget. During anneal steps for forming $TiSi_2$ in contact holes, relatively high pressure allows for better electrical characteristics in resulting $TiSi_2$ layers and a reduction in the processing temperature required to form such layers. During metal filling of contact holes, a relatively high pressure force-fill allows for better step coverage of high aspect ratio contact holes and filling of the contact hole with relatively few, if any, voids therein. Thus, tungsten plugs are not needed in such high aspect ratio contact holes. Instead, lower resistivity aluminum can be used to fill such high aspect ratio contact holes. Furthermore, interconnects formed using such relatively high pressure techniques do not mandate the necessity for a TiN adhesion layer between adjacent layers in interconnects. Interlayer dielectrics may also be annealed using the method of the invention. Since the space between capacitor containers may also exhibit structures with high aspect ratios, the "force-filling" effect of using high pressures provides dielectrics which have greatly reduced voids. The temperature range for the anneals or reflows described herein will vary with the pressure selected. Higher pressures generally allow lower temperatures to be used, and thus a desired conservation of thermal budget. Even lower temperatures than those described may be sufficient when the pressure is increased above the average ranges of 10 to 50 atmospheres.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming an interconnect in a contact hole defined by walls of an insulating material and a supporting substrate, comprising the steps of:

depositing titanium on the supporting substrate at the bottom of the contact hole;

depositing a titanium nitride layer on the walls of the contact hole and the supporting substrate, the height of the walls of the contact hole being at least twice the diameter of the contact hole;

annealing the supporting substrate at a pressure of at least approximately 1.1 atmospheres to form titanium silicide between the supporting substrate and the titanium nitride layer;

filling the contact hole with a conductive material deposited on the titanium nitride layer by a CVD process, utilizing a pressure of at least approximately 1.1 atmospheres; and forming a metal line on the conductive material over the contact hole.

2. The method of claim 1, wherein the contact hole has an aspect ratio of at least 2:1.

3. The method of claim 1, wherein the conductive material comprises aluminum.

4. A method for forming an interconnect in a contact hole defined by walls of an insulating material and a supporting substrate, comprising the steps of:

depositing titanium on the supporting substrate;

annealing the supporting substrate at a pressure of at least approximately 1.1 atmospheres to form titanium silicide on the supporting substrate;

filling the contact hole with a conductive material by a CVD process, utilizing a pressure of at least approximately 1.1 atmospheres the depth of the contact hole being at least twice the diameter of the contact hole; and forming a metal line on the conductive material over the contact hole.

5. The method of claim 4, wherein the contact hole has an aspect ratio of at least 2:1.

6. The method of claim 4, wherein the annealing step comprises annealing in a processing chamber having an inert gas ambient.

7. The method of claim 4, wherein the annealing step comprises annealing in a processing chamber having a nitrogen-containing ambient.

8. The method of claim 4, wherein the conductive material comprises aluminum.

9. The method of claim 4, wherein the conductive material comprises tungsten.

* * * * *